US011271028B2

(12) United States Patent
Levy et al.

(10) Patent No.: US 11,271,028 B2
(45) Date of Patent: Mar. 8, 2022

(54) GERMANIUM ON INSULATOR FOR CMOS IMAGERS IN THE SHORT WAVE INFRARED

(71) Applicant: TriEye Ltd., Tel-Aviv (IL)

(72) Inventors: Uriel Levy, Kiryat Ono (IL); Omer Kapach, Jerusalem (IL); Avraham Bakal, Tel-Aviv (IL); Assaf Lahav, Binyamina (IL); Edward Preisler, San Clemente, CA (US)

(73) Assignee: TriEye Ltd., Tel Aviv (IL)

( * ) Notice: Subject to any disclaimer, the term of this patent is extended or adjusted under 35 U.S.C. 154(b) by 0 days.

(21) Appl. No.: 16/762,944

(22) PCT Filed: Feb. 11, 2019

(86) PCT No.: PCT/IB2019/051086
§ 371 (c)(1),
(2) Date: May 11, 2020

(87) PCT Pub. No.: WO2019/155435
PCT Pub. Date: Aug. 15, 2019

(65) Prior Publication Data
US 2020/0365630 A1    Nov. 19, 2020

Related U.S. Application Data

(60) Provisional application No. 62/629,245, filed on Feb. 12, 2018.

(51) Int. Cl.
*H01L 27/146* (2006.01)
*H01L 31/18* (2006.01)

(52) U.S. Cl.
CPC ...... *H01L 27/1465* (2013.01); *H01L 27/1462* (2013.01); *H01L 27/1469* (2013.01);
(Continued)

(58) Field of Classification Search
CPC ............ H01L 27/1465; H01L 27/1462; H01L 27/14627; H01L 27/1469; H01L 31/1808;
(Continued)

(56) References Cited

U.S. PATENT DOCUMENTS 8,809,672 B2     8/2014  Chuang et al.
8,956,909 B2 *   2/2015  Tseng ............... H01L 27/14632
                                                         438/69

(Continued)

FOREIGN PATENT DOCUMENTS

WO       2017065692 A1    4/2017

OTHER PUBLICATIONS

Office Action in related EP application 19751901.0, dated Dec. 22, 2020, 5 pages.

*Primary Examiner* — Sitaramarao S Yechuri
(74) *Attorney, Agent, or Firm* — Nathan & Associates; Menachem Nathan

(57) ABSTRACT

Light detecting structures comprising germanium (Ge) photodiodes formed in a device layer of a germanium on-insulator (GeOI) wafer, focal planes arrays based on such Ge photodiodes (PDs) and methods for fabricating such Ge photodiodes and focal plane arrays (FPAs). An FPA includes a Ge-on-GeOI PD array bonded to a ROIC where the handle layer of the GeOI layer is removed. The GeOI insulator properties and thickness can be designed to improve light coupling into the PDs.

14 Claims, 5 Drawing Sheets

(52) U.S. Cl.
CPC .... *H01L 27/14627* (2013.01); *H01L 31/1808* (2013.01); *H01L 31/1892* (2013.01)

(58) Field of Classification Search
CPC ............. H01L 31/1892; H01L 31/0264; H01L 31/101; H01L 31/04; H01L 31/02; H01L 31/028; Y02E 10/50
See application file for complete search history.

(56) References Cited

U.S. PATENT DOCUMENTS

| | | |
|---|---|---|
| 2003/0138201 A1 | 7/2003 | Nikolas |
| 2010/0285630 A1* | 11/2010 | Lee ................... H01L 27/14636 438/70 |
| 2014/0263958 A1* | 9/2014 | Her ..................... H01L 27/1463 250/208.1 |
| 2017/0025454 A1 | 1/2017 | Cheng et al. |
| 2018/0151619 A1* | 5/2018 | Yamashita ........ H01L 27/14636 |

* cited by examiner

Light

GERMANIUM ON INSULATOR FOR CMOS IMAGERS IN THE SHORT WAVE INFRARED

CROSS REFERENCE TO RELATED APPLICATIONS

This application is a 371 application from international patent application PCT/IB2019/051086 filed Feb. 11, 2019, which claims the benefit of U.S. Provisional patent application No. 62/629,245 filed Feb. 12, 2018, which is incorporated herein by reference in its entirety.

FIELD

Embodiments disclosed herein relate in general to focal plane array (FPA) devices and in particular to Germanium (Ge) based FPAs that detect light in the short wave infrared (SWIR) spectral regime.

BACKGROUND

Cameras that can operate in the short wave infrared (SWIR) are becoming increasingly important for variety of applications. As commonly accepted, the SWIR range extends between 0.9 and 1.7 micrometers ($\mu m$). As an example, any application that relies on active illumination can benefit from operating in the SWIR regime due to the much higher optical power that is allowed to be used by eye safety regulations. Sensors used in SWIR cameras function similarly to silicon based complementary metal oxide semiconductor (CMOS) sensors (also referred to as "photodetectors" or "PD"s) by working as quantum detectors. Photons excite the electrons from one energy level to another, leading to conversion of light into an electrical current. As the bandgap of silicon does not support photodetection of wavelengths above ~1.1 $\mu m$, SWIR sensors are typically made of materials such as indium gallium arsenide (InGaAs). While InGaAs sensors can provide high quality focal plane arrays (FPAs) with high quantum efficiency and relatively low dark current, their utilization is expensive, essentially preventing them from being implemented in many of the consumer market applications.

It is thus highly desired to realize CMOS-compatible sensors and/or FPAs for SWIR cameras that would enable low cost implementation.

Germanium (Ge)-based sensors are known. Ge is fairly compatible with silicon as it is situated in Group IV of the periodic table and can be grown directly on silicon. Various foundries now integrate Ge processes into their CMOS lines. In known art, a Ge-based PD or FPA may be integrated with a Si-based readout integrated circuit (ROIC) by growing a Ge layer (in which Ge PDs are formed) epitaxially on top of the Si-based ROIC. This approach has two major disadvantages: a) there is a 4.2% lattice mismatch between Si and Ge, resulting in residual dislocations in the Ge layer that lead to higher PD leakage current and, sometimes, to reduced process yield; and b) the growth of the Ge layer on top of the ROIC needs to be done at low temperature, thus further degrading the Ge layer quality.

"Ge-on-insulator" (GeOI) wafer are also known and are commercially available (supplied for example by IQE Silicon, Pascal Close, Cardiff, CF3 0LW, UK). FIG. 1 illustrates schematically a cross section of a GeOI wafer, which comprises a handle layer (e.g. silicon or germanium substrate) 102, a respective insulator (e.g. oxide) 104 and a single crystal Ge "device" layer 106. The thickness of the Ge device layer may range between 0.2 and 10 micrometers ($\mu m$).

GeOI wafers are known to be used for fabrication of microelectronic devices. However, there is no known use of GeOI wafers for optical (photo) detection.

SUMMARY

In various embodiments there are provided light detecting structures comprising at least one germanium (Ge) photodiode formed in a Ge device layer of a GeOI wafer, wherein the GeOI wafer includes a handle layer and an insulator layer between the handle layer and the Ge device layer.

In an exemplary embodiment, the insulator includes silicon oxide.

In an exemplary embodiment, the insulator includes germanium oxide.

In an exemplary embodiment, the insulator layer is a quarter wave layer.

In an exemplary embodiment, the insulator layer is replaced by an anti-reflection coating.

In an exemplary embodiment, the handle layer is made of silicon.

In an exemplary embodiment, the at least one Ge photodiode is a vertical PN photodiode. In other embodiments, a Ge photodiode may be a vertical PIN diode or a horizontal PN or PIN diode.

In an exemplary embodiment, the at least one Ge photodiode includes an array of Ge photodiodes formed in the Ge device layer. Each Ge photodiode of the array of Ge photodiodes can detect light in the short wave infrared (SWIR) regime.

In exemplary embodiments, adjacent Ge photodiodes of the array of Ge photodiodes are electrically isolated from each other.

In exemplary embodiments, there are provided FPAs comprising the Ge device layer with the array of Ge photodiodes coupled mechanically and electrically to a ROIC.

In exemplary embodiments, there are provided methods for forming a light detecting structure comprising providing a GeOI wafer that includes a handle layer, a Ge device layer and an insulator layer between the handle layer and the Ge device layer, and forming at least one Ge photodiode in the Ge device layer.

In an exemplary embodiment, the forming at least one Ge photodiode in the Ge device layer includes forming an array of Ge photodiodes.

In an exemplary embodiment, a method further comprises coupling the array of Ge photodiodes mechanically and electrically to a ROIC and removing the handle layer to provide a FPA.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure are generally labeled with a same numeral in all the figures in which they appear. The drawings and descriptions are meant to illuminate and clarify embodiments disclosed herein, and should not be considered limiting in any way. In the drawings.

DETAILED DESCRIPTION

Figure 1:
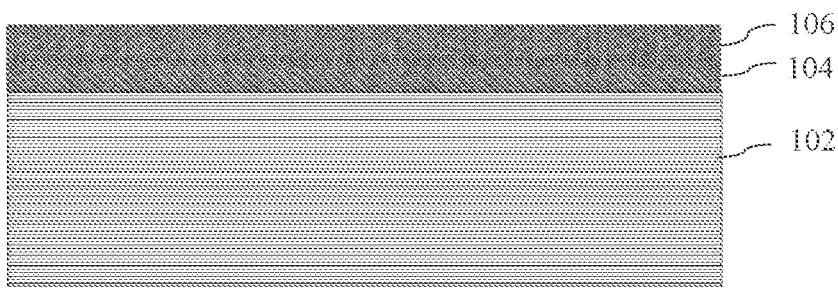
FIG. 1 illustrates schematically a cross section of a GeOI wafer.
Figure 2A:
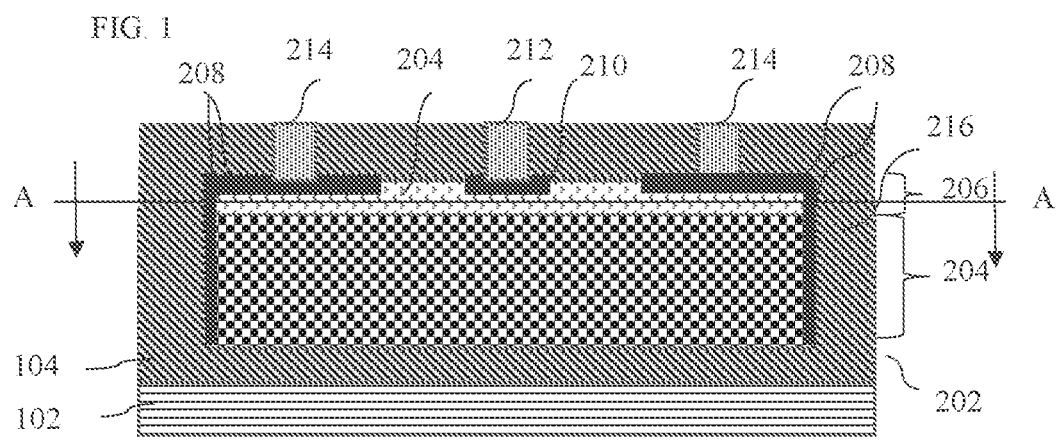
FIG. 2A shows schematically a side view cross section of a single pixel structure disclosed herein.
Figure 2B:
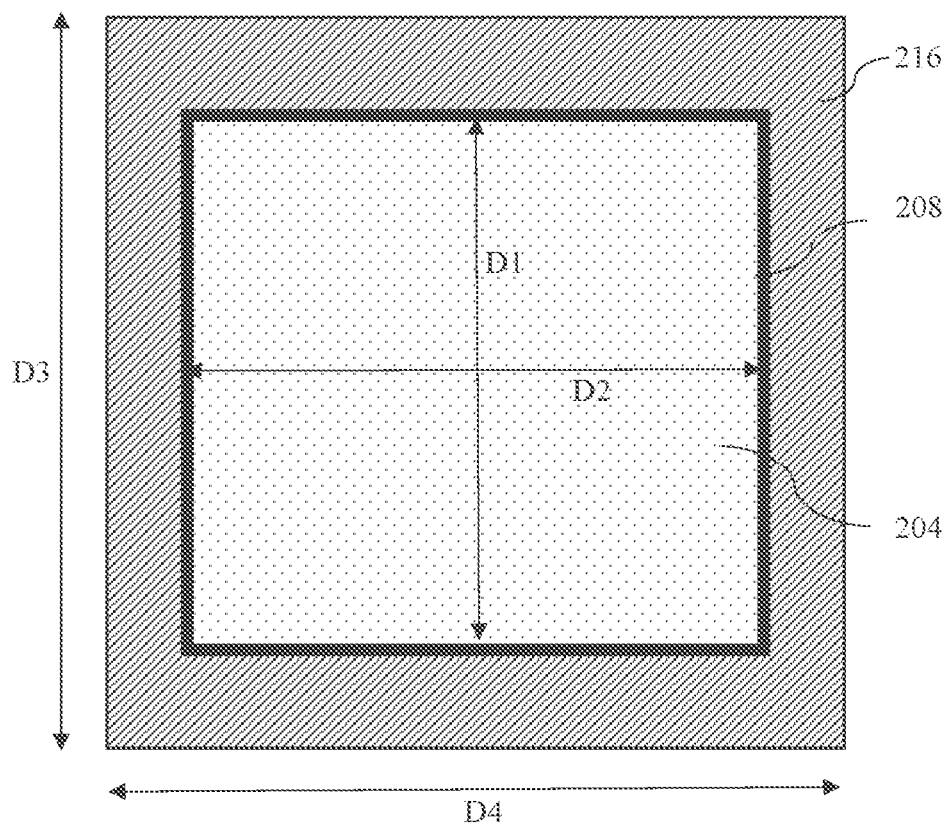
FIG. 2B shows schematically the single pixel structure of FIG. 2A in a top view at a section A-A.

Returning now to the drawings, FIG. 2A shows schematically a side view cross section of a single pixel Ge-on-GeOI structure disclosed herein and numbered 200. FIG. 2B shows schematically single pixel structure 200 in a top view at a section A-A. Pixel structure 200 is formed in single crystal layer 106 and comprises a Ge PD 202 having either a PN or a PIN structure. As shown, PD 202 has exemplarily a PN structure with a P-doped region 204 and a N-doped region 206. In some embodiments, the P and N regions may be switched. In general, the PD may be in the form of a vertical PN junction as shown (i.e. the P and N regions are arranged in the direction of incoming light) a horizontal PN junction (not shown), a PIN diode (not shown) or any other type of diode. A (higher than the P doping) P+ doped region 208 and a (higher than the N doping) N+ doped region 210 serve as respective ohmic contacts and passivation to metallizations 212 and 214 for external electrical contacts. Trench isolations 216 separate PD 202 from adjacent PDs. The trenches are filled with an insulator such as silicon oxide, which also covers the top of the pixel (the PD region on top of the Ge with vias and electrical contacts). The electrical contacts are defined in the insulator for connecting the pixel to additional metal layers (not shown) which will be connected to a ROIC wafer. The dopings, ohmic contacts and metallizations may be similar to those of known Ge PDs. The area of a pixel is essentially the PD area plus half the isolation area between adjacent PDs.

A PD 202 may have any number of shapes. In particular, the PD shape be rectangular, with dimensions D1 and D2 shows in FIG. 2B being equal (i.e. square) or non-equal. Similarly, a pixel may have any shape and in particular may be rectangular with dimensions D3 and D4. D3 and D4 may be the same (square) or non-equal. In some examples with square PDs, D1=D2 may be in a range of 1-30 µm. In some examples with square pixels, D3=D4 may be in a range of 2-31 µm, i.e. the separation (and isolation) between adjacent PDs may be at a minimum about 2 µm. The rectangular/square shape is provided for example only, and as mentioned, a PD/pixel may have other shapes, for example a hexagonal shape. Minimal dimensions of various features (including pixel and PD dimensions) may be limited only by process tolerances.

Figure 3:
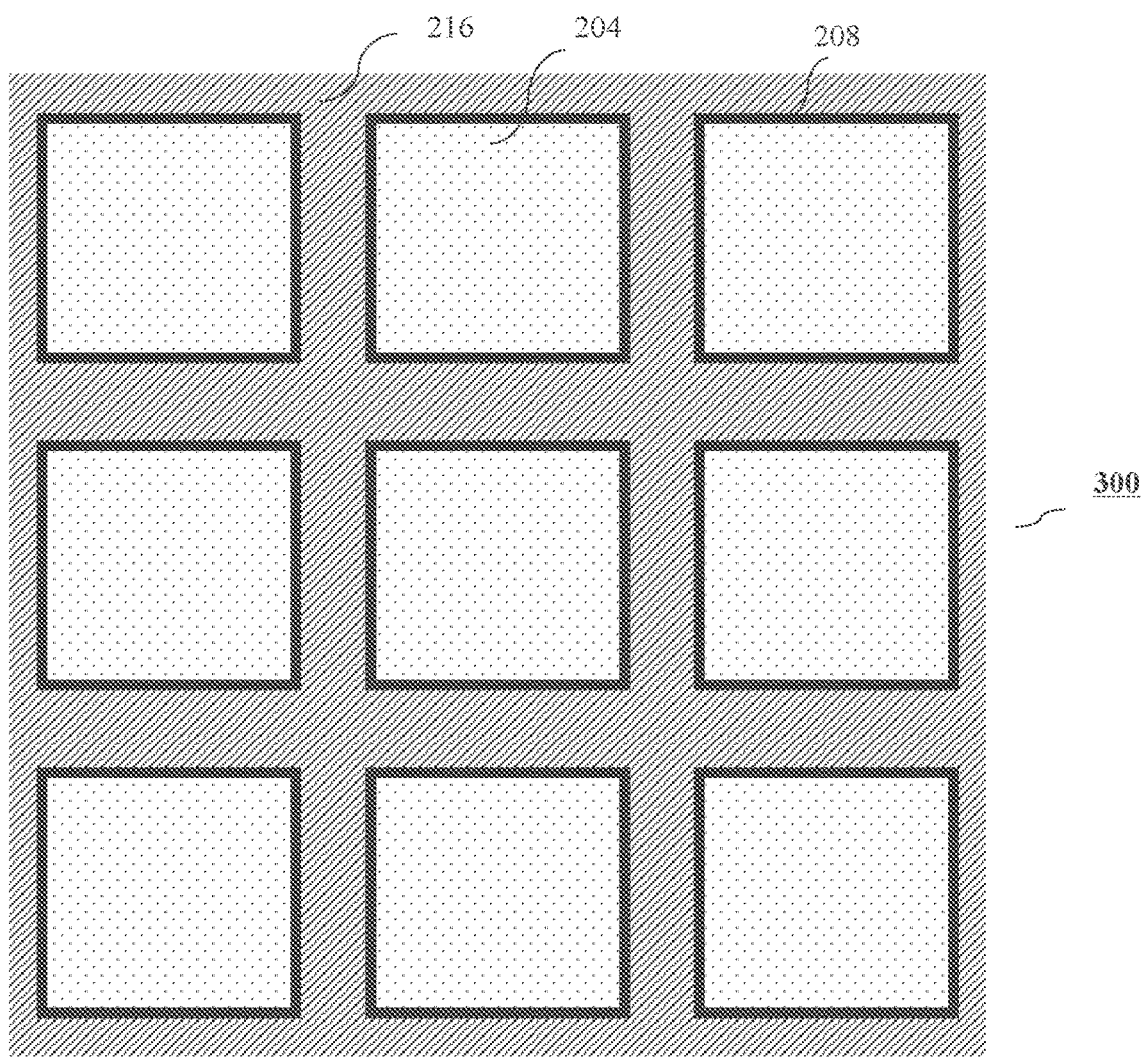
FIG. 3 shows an array of pixels as in FIG. 2B from a top view.

A plurality of Ge PDs may be fabricated on a GeOI wafer ("wafer level processing") to provide a photosensitive (PS) wafer. FIG. 3 shows an array of pixels numbered 300 as in FIG. 2B from a top view. A given array of PDs (and pixels), from a few pixels to a few million pixels and even more), defines a die. A PS water includes many such dies, typically on the order of a few hundreds. When coupled electrically to a ROIC, the PD array may operate as a focal plane array (FPA), see FIGS. 4A-4C.

Figure 4A:
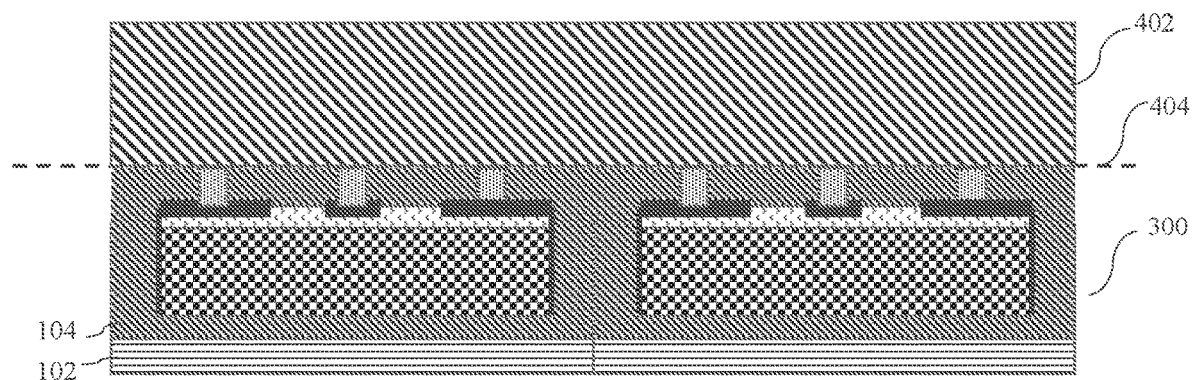
FIG. 4A shows schematically in side cross section a section of a Ge-based PS wafer bonded to a ROIC wafer.
Figure 4B:
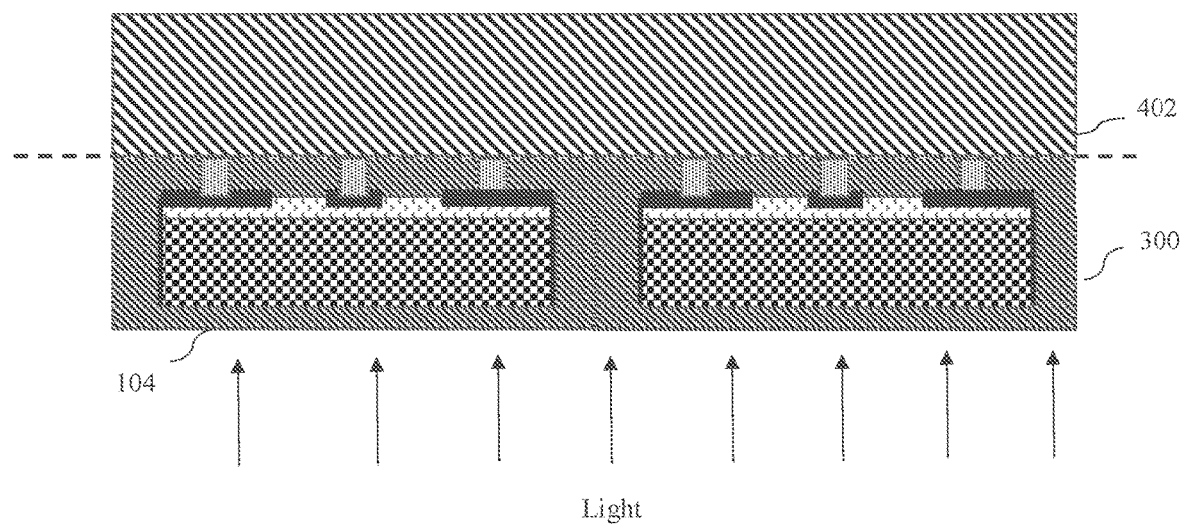
FIG. 4B shows schematically in side cross section the structure of FIG. 4A with the handle layer removed to provide a FPA.
Figure 4C:
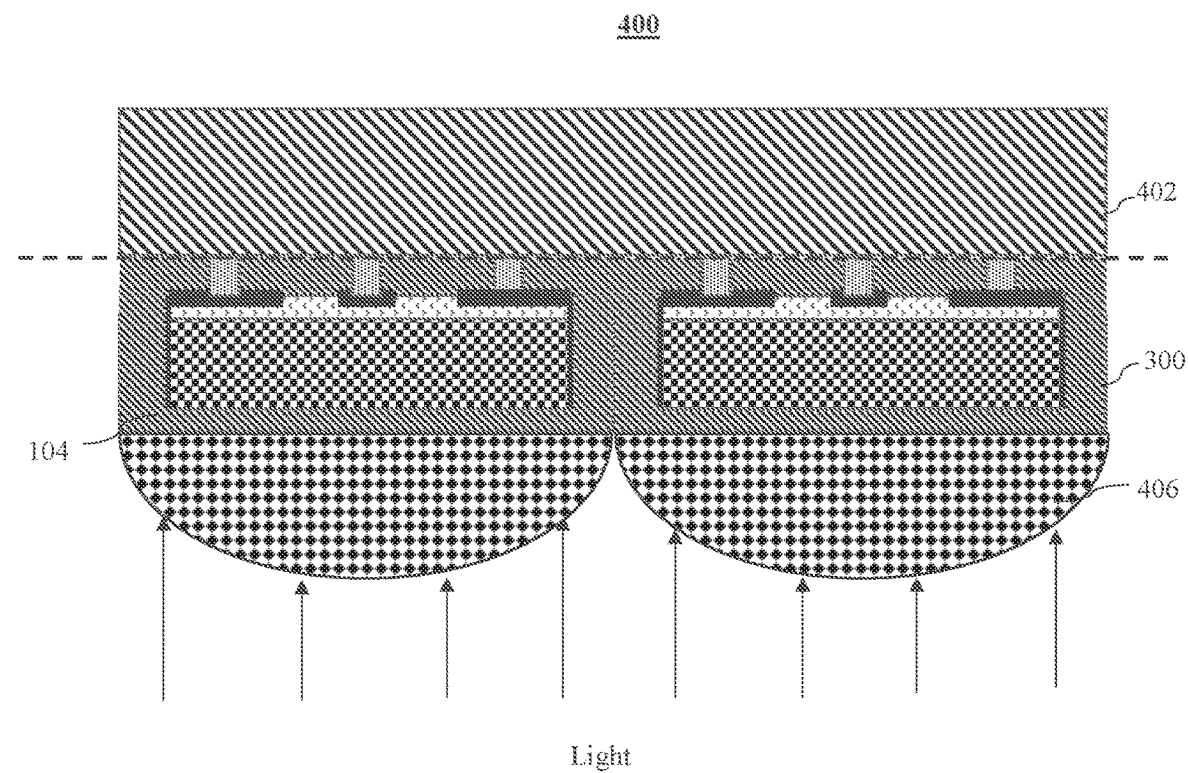
FIG. 4C shows schematically in side cross section the structure of FIG. 4B with the addition of microlenses.

FIG. 4A shows schematically in side cross section a section of a Ge-based PS wafer 310 bonded to a ROIC wafer 402 to form a bonded structure 400. A broken bonded line 404 shows the physical connection between the two wafers. Bonding can be performed in many known ways, for example using the ZiBond™ or DBI® technologies. FIG. 4B shows schematically in side cross section the structure of FIG. 4A with handle layer 102 removed to provide a FPA. To clarify, as used herein, the term "FPA" relates to a Ge-on-GeOI PD array bonded to a ROIC where the handle layer of the GeOI layer is removed, exposing the insulator layer (or a replacing anti-reflection (AF) layer, see below) to incoming light. Optionally, microlenses can be added on the FPA side receiving light to enhance light absorption. This is illustrated in FIG. 4C, which shows schematically in side cross section structure 400 with added microlenses 406.

In general, a FPA based on Ge PD arrays coupled mechanically and electrically to a ROIC may include forming an array of Ge PDs in a device layer of a GeOI wafer, bonding the GeOI wafer with the array of PDs to a ROIC such that each PD is electrically connected to the ROIC and removing the device layer to expose the insulator layer and the PDs to incoming light. An optional step would be to remove also the insulator layer and replace it with an AF coating. A further optional step would be to add microlenses as described above either over the insulator layer or the AF coating.

Figure 5:
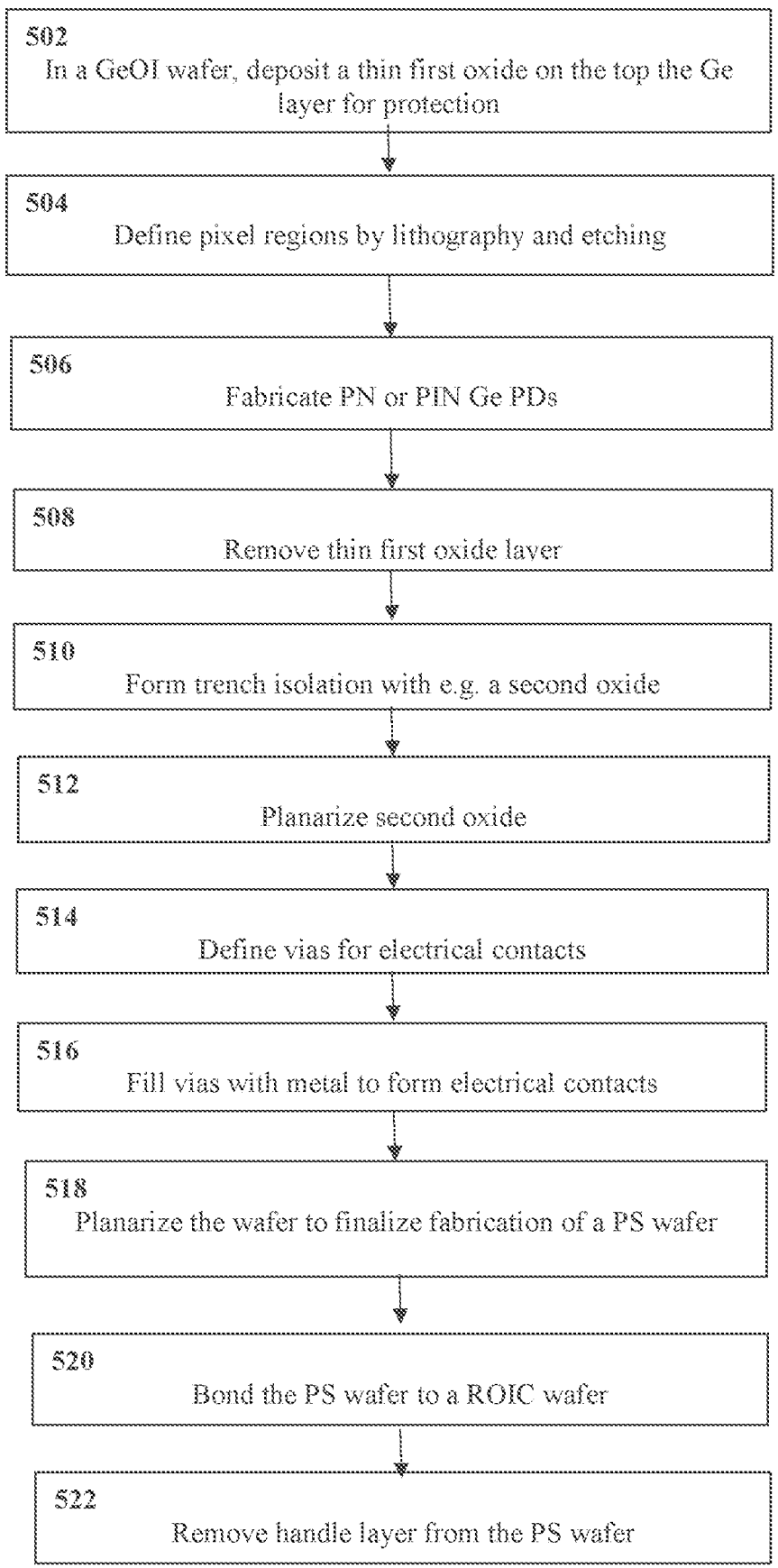
FIG. 5 illustrates in a flow chart an exemplary embodiment of a wafer scale process for manufacturing a Ge on GeOI-based FPA disclosed herein.

FIG. 5 shows in a flow chart detailed steps of an exemplary wafer scale process for manufacturing a Ge on GeOI-based FPA. The description of the process is done in conjunction with structures shown in FIGS. 2-4.

In step 502, a thin (e.g. 10-20 nm) "top" oxide layer is deposited or grown on top of Ge layer 106, by well-known processes such as liquid phase chemical vapor deposition (LPCVD) or liquid plasma enhanced chemical vapor deposition (PECVD). In step 504, the geometry of the pixels is defined by lithography, followed by etching the periphery of the Ge around the pixels to separate between neighboring pixels. The etching leads to the formation of trenches to be filled with an appropriate material for trench isolations 216. In step 506, an array of e.g. PN or PIN Ge PDs is fabricated by known methods, i.e. ion implantation and dopant activation. In step 508, the first top thin oxide is removed (e.g. by etching). In step 510, trench isolation is performed by filling the areas etched in step 504 with a filler such as an oxide ("second oxide"). The second oxide thickness needs to be greater (e.g. by 2-3 µm) than the Ge layer thickness, to support the realization of contacts. In step 512, the second oxide is planarized, e.g. by chemo-mechanical polishing (CMP), such that the oxide thickness is uniform across the wafer. In step 514, vias for electrical contacts are defined by lithography and oxide etching. In step 516, the vias are filled by metal to form the electrical contacts. A thermal treatment may be performed as needed to reduce contact resistance. In step 518, the wafer is planarized, e.g. by CMP to finalize the fabrication of a PS wafer and to prepare the PS wafer for a bonding process. Finally, in step 420, the PS wafer is flipped upside down and bonded to an ROIC wafer with the device layer facing the ROIC wafer. This is followed by removal of the handle layer in step 522.

After the removal of the handle water, the Ge is protected by the oxide of the original GeOI wafer. Ideally, it would be beneficial to use this oxide as an anti-reflective (AF) coating, to reduce the reflectance of light impinging from free space onto the Ge FPA. Consequently, in an embodiment, the thickness insulator layer 104 may be designed such that it matches the condition of a quarter-wave layer, e.g. for 1.5 micron wavelength. This can provide a dramatic reduction in reflection from over 30% to only a few percent. In an alternative embodiment, insulator layer 104 may be removed after step 522 and replaced with another layer having a refractive index of around 2, which provides a good AF coating between Ge and air. In yet other alternative embodiments, a quarter-wave stack may be used instead of a single quarter-wave layer. This way, broadband reflection can be achieved for larger range of acceptance angles. As mentioned, in some embodiments, microlenses 406 can be added such that each microlens is assigned to a pixel for the purpose of improving the light collection efficiency into the pixel. The bonded wafer is finally cut into individual dies, which are packaged to allow electrical and optical functionality.

The light detecting structures described above and claimed below and methods of fabricating such structures provide high quality low cost CMOS-compatible FPAs for the SWIR regime. The use of GeOI wafers instead of Ge wafers provides at least one significant advantage: the Ge device layer on top of the insulator can be fabricated to a desired small specific thickness (typically a few micrometers). That is, the thickness of the PD absorption layer can be optimized to the desired value. This in contrast with a Ge wafer, which is typically of few hundreds of microns thick and cannot be thinned down to the desired thickness with sufficient precision. The other alternative for the production of Ge layer with the desired small specific thickness is to epitaxially grow the Ge device layer on silicon. However, this produces a lower grade Ge layer with significant dislocation density due to the 4.2% lattice mismatch between Ge and silicon. A further advantage in the use of GeOI instead of Ge wafers lies in the role and properties of the insulator, as described above.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

All references mentioned in this specification are herein incorporated in their entirety by reference into the specification, to the same extent as if each individual reference was specifically and individually indicated to be incorporated herein by reference. In addition, citation or identification of any reference in this application shall not be construed as an admission that such reference is available as prior art to the present invention.

What is claimed is:

1. A method for forming a light detecting structure, comprising:
   a) providing a germanium-on-insulator (GeOI) wafer that includes a handle layer, a Ge device layer and an insulator layer between the handle layer and the Ge device layer, wherein the insulator layer is a quarter wave layer;
   b) forming an array of Ge photodiodes in the Ge device layer;
   c) coupling the array of Ge photodiodes mechanically and electrically to a read only integrated circuit; and
   d) removing the handle layer to provide a focal plane array.

2. The method of claim 1, wherein the insulator layer includes silicon oxide.

3. The method of claim 1, wherein the insulator includes germanium oxide.

4. The method of claim 1, wherein each Ge photodiode of the array of photodiodes is a vertical PN photodiode.

5. The method of claim 1, wherein adjacent Ge photodiodes of the array of Ge photodiodes are electrically isolated from each other.

6. The method of claim 1, wherein the focal plane array can detect light in the short wave infrared (SWIR) regime.

7. The method of claim 1, wherein the quarter-wave layer is replaced by a quarter-wave stack.

8. A device, comprising:
   a) an array of germanium (Ge) photodiodes formed in a Ge device layer of a germanium-on-insulator (GeOI) wafer, wherein a handle layer of the GeOI wafer is removed to leave an insulator layer of the GeOI wafer facing incoming light and wherein the insulator layer is a quarter wave layer; and
   b) a silicon readout integrated circuit (ROIC) bonded to the Ge device layer, wherein the array of Ge photodiodes is coupled electrically to the ROIC to form a focal plane array for detecting the incoming light.

9. The device of claim 8, wherein the insulator includes silicon oxide.

10. The device of claim 8, wherein the insulator includes germanium oxide.

11. The device of claim 8, wherein each Ge photodiode is a vertical PN photodiode.

12. The device of claim 8, wherein adjacent Ge photodiodes of the array of Ge photodiodes are electrically isolated from each other.

13. The device of claim 8, wherein the light is in the short wave infrared (SWIR) regime.

14. The device of claim 8, wherein the quarter-wave layer is replaced by a quarter-wave stack.

* * * * *